United States Patent
Mizuhashi et al.

(10) Patent No.: US 7,373,566 B2
(45) Date of Patent: May 13, 2008

(54) SEMICONDUCTOR DEVICE FOR ACCURATE MEASUREMENT OF TIME PARAMETERS IN OPERATION

(75) Inventors: Hiroshi Mizuhashi, Yokohama (JP); Toyoaki Yamamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 122 days.

(21) Appl. No.: 11/305,230

(22) Filed: Dec. 19, 2005

(65) Prior Publication Data

US 2006/0156114 A1 Jul. 13, 2006

(30) Foreign Application Priority Data

Dec. 21, 2004 (JP) .............................. 2004-369206

(51) Int. Cl.
G01R 31/28 (2006.01)
(52) U.S. Cl. .................................................. 714/724
(58) Field of Classification Search ................. 714/724
See application file for complete search history.

(56) References Cited

U.S. PATENT DOCUMENTS 6,415,403 B1 * 7/2002 Huang et al. ............... 714/726
6,438,720 B1 * 8/2002 Boutaud et al. ............ 714/724
7,007,215 B2 * 2/2006 Kinoshita et al. ........... 714/745

FOREIGN PATENT DOCUMENTS

| JP | 05-264675 | 10/1993 |
|----|-----------|---------|
| JP | 11-174121 | 7/1999 |
| JP | 2002-162444 | 6/2002 |

* cited by examiner

*Primary Examiner*—James C. Kerveros
(74) *Attorney, Agent, or Firm*—Donald R. Studebaker

(57) ABSTRACT

A memory-logics LSI device forms an input/output path for testing. A memory device has a memory input/output unit, which includes an input/output selector with test function. A test clock signal, which is directly supplied in the test mode, is used to selectively take in one of input signals and an output signal to output the signal. The output is monitored on an external pin, while changing the timing of the positive-going edge of the clock signal, or the input signals. Relative measurement is then made on a delay amount indicating to which extent the input signals are delayedto cause a phase shift with respect to the clock signal,at the timing immediately before input to and after output from the memory device.

4 Claims, 7 Drawing Sheets

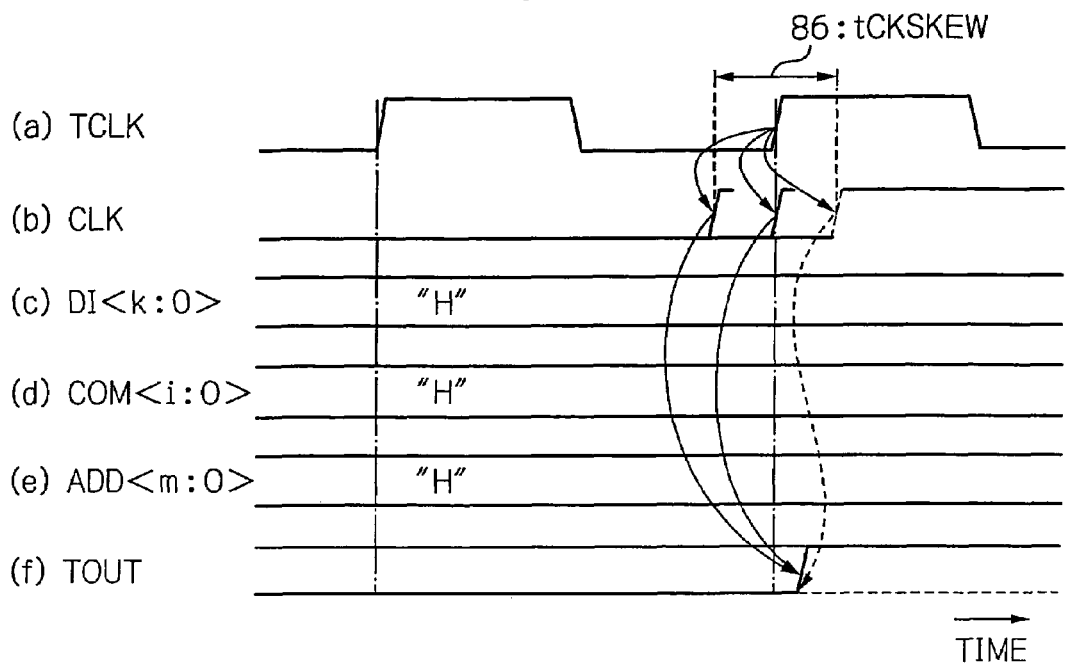
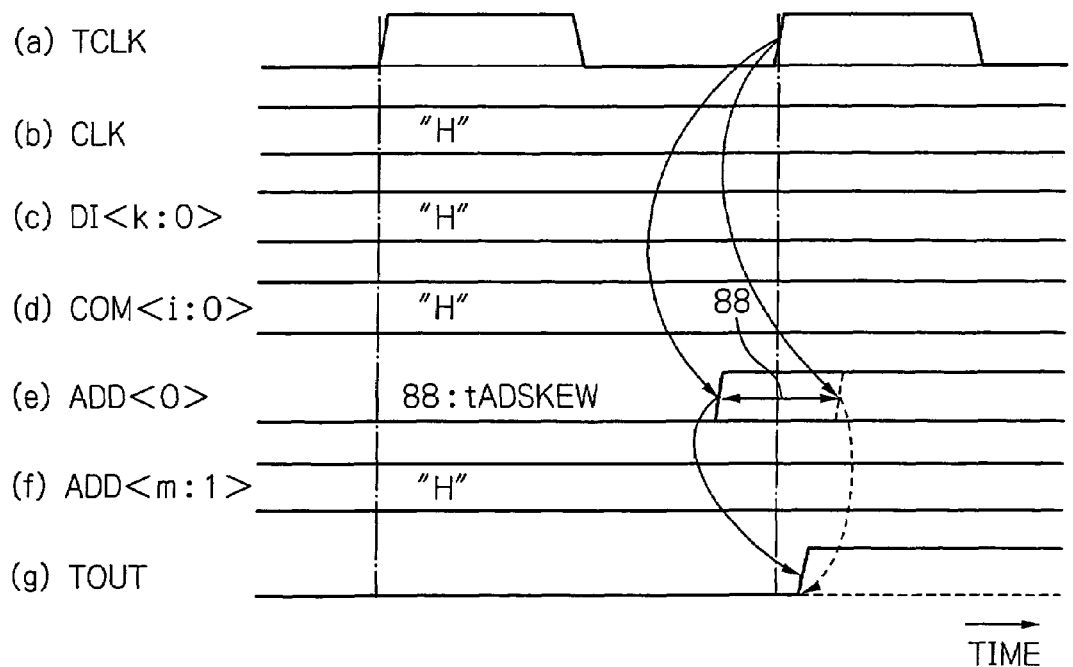

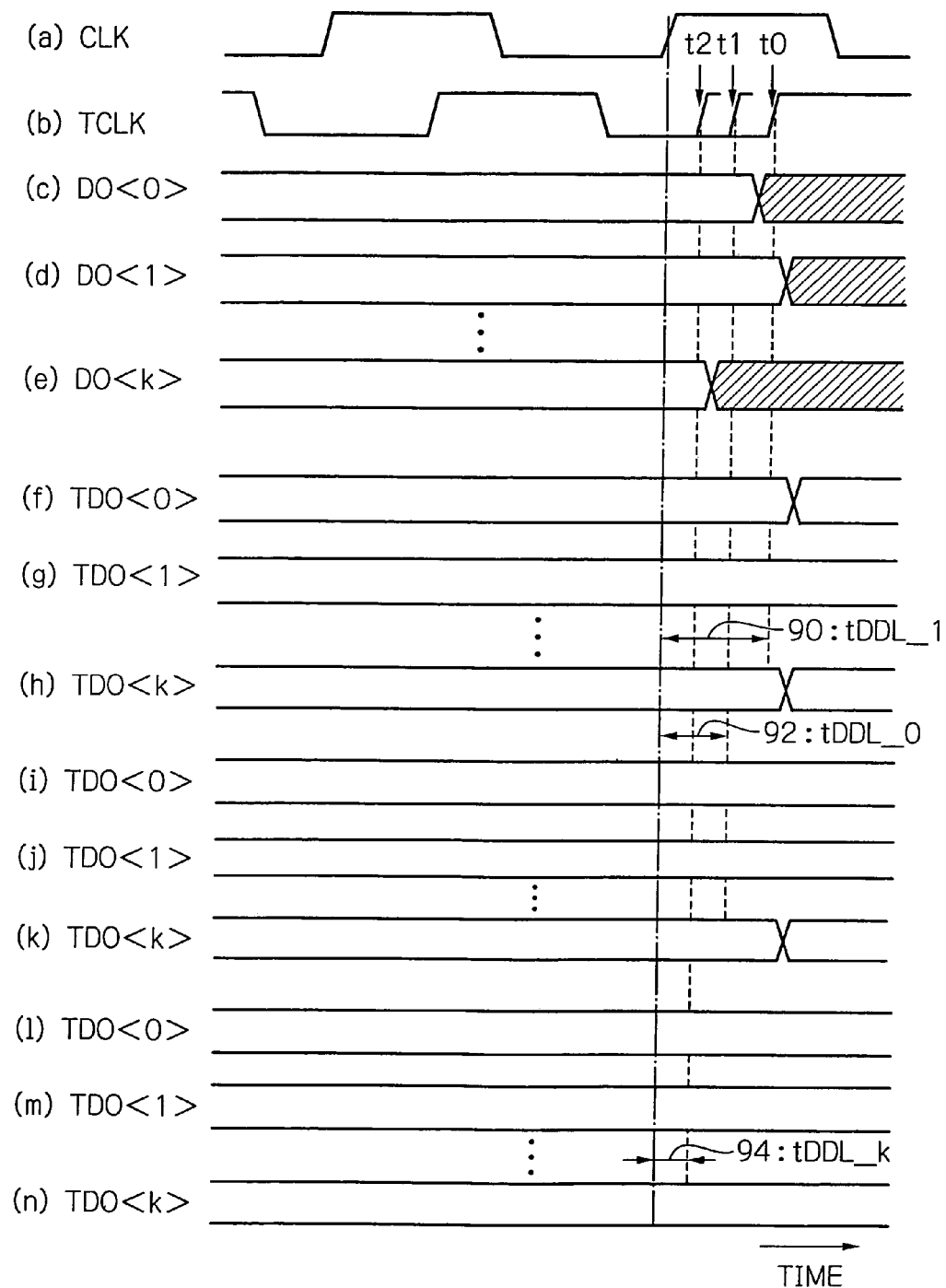

SEMICONDUCTOR DEVICE FOR ACCURATE MEASUREMENT OF TIME PARAMETERS IN OPERATION

BACKGROUND OF THE INVENTION

1. Field of the Invention

The present invention relates to a semiconductor device, and more particularly to a semiconductor device capable of accurately measuring a time parameter, such as the setup/hold time and the access time, of a synchronous memory device mounted on an LSI (large-scale integration) device together with synchronous logics integrated thereon.

2. Description of the Background Art

In general, a memory-logics LSI device, integrated on a semiconductor substrate, includes a memory or storage device, logics, an external signal switching circuit and a memory-logics interface (IF) signal switching circuit. Briefly describing the interconnection of these components, the memory-logics interface signal switching circuit is arranged between the memory device and the logics. The memory-logics interface signal switching circuit is supplied with an input signal from the logics on its input path to output the signal to the memory device from its output path. The memory-logics interface signal switching circuit is also supplied with a signal from the memory device on its other input path to deliver the signal to the logics from its other output path.

Between the external input/output pins of the integrated circuit and the logics, an external signal switching circuit is provided. The external signal switching circuit is supplied with a signal supplied from outside on its input path, to output the supplied signal from its output path to the external input/output pins. By the interconnection stated above, the memory-logics LSI device is thus adapted to transmit and receive the signals.

The memory-logics LSI device has a memory test mode evaluating the characteristics of the memory device. In the memory test mode, the external signal switching circuit and the memory-logics interface signal switching circuit of the memory-logics LSI device are made operative as a test interface circuit, and a test input path and a test output path are arranged to be directly used as an internal data transfer path without the intermediary of the logics disposed between the external signal switching circuit and the memory-logics interface signal switching circuit.

The memory configuration will now be described. The memory device includes a memory input/output unit and a memory controller, through which data are transferred to and from the synchronous memory. In particular, the memory input/output unit uses, for each input, an input buffer, a delay for timing adjustment and a flip-flop circuit, while using, for each output, an output buffer. In respect of clocks, an input buffer and a clock driver are provided. The flip-flop circuit used on the input side and the output buffer used on the output side are supplied with input clocks and output clocks, respectively.

The memory-logics LSI device structured as stated above makes the internal data transfer path operative to measure the setup/hold time and the access time of the memory device. The setup/hold time and the access time in the memory-logics LSI device are measured with the delay involved which is encountered on the internal signal paths such as the external signal switching circuit from the input/output pins to the memory device and the direct input/output path.

Several other examples of memory operational test have been proposed. The semiconductor integrated circuit device disclosed in Japanese patent laid-open publication No. 264675/1993 aims at improving the accuracy of the operational test of a memory device mounted on the integrated circuit device. In the circuit device, a memory device and a logic circuit are formed on the same semiconductor chip and an operational test of the memory device is carried out in response to an address signal entered from a terminal dedicated to testing on the chip. In response to this multi-bit address signal, entered from the terminal, the memory test circuit provides the input port of the memory device with the multi-bit address signal, and thereafter outputs a write control signal of a predetermined pulse duration to the memory device in response to the multi-bit address signal. That causes the operational test to be conducted without being affected by variations in the signal transfer time, thus improving accuracy in operational test.

The memory device integrated together with logics and the testing method therefor, disclosed in Japanese patent laid-open publication No. 174121/1999, intend to reduce the number of the transitions at the time of switching test modes to thereby improving the test efficiency and reducing the noise. The memory device is provided with an ordinary operational test mode for testing a memory core via a logic circuit, and a bypass test mode for entering information from an external pad without the intermediary of the logic circuit to directly test the memory core. The test circuit is thus used in common to the logic circuit and the memory core. The test selection information from a mode register or the test selection information from multiplexers is selected by another multiplexer, so that the selected information is supplied to the test circuit to enable the setting and the execution of the test mode.

The apparatus and method for testing a semiconductor integrated circuit, disclosed in Japanese patent laid-open publication No. 2002-162444, improve the situation in which the LSI device is not actually operative when the memory is tested to cause unforeseen operational troubles during actual use, or in which the memory and the random logics are tested independently of each other to thereby increase the cost for testing. For that aim, the memory device is supplied with a test signal separately from the logics, and the logics are supplied with an operating signal for intentionally being rendered operative. Hence, the operating state may be established closely to the actual operating state. In addition, the memory test and the scanning test may be conducted simultaneously, and therefore the test time may be shorter, whilst the cost for testing may also be reduced.

The case of evaluating memory characteristics in the memory-logics LSI device, indicated above, will now briefly be described. In measuring the access time by the above-indicated configuration, a clock signal is supplied over connections of the external input pins, external signal switching circuit, memory-logics interface signal switching circuit and memory input buffer. On the other hand, the output data from the memory device are supplied over connections of the memory-logics interface signal switching circuit, external signal switching circuit and external connection pins. Those connections cause the actual access time to be measured including the time required from inputting an external clock to outputting external data, that is, the delay time caused by the above-described circuits and the load on the connections.

Turning now to the setup/hold time, the input signal is supplied over the connections of the external input pins, external signal switching circuits, memory-logics interface signal switching circuit and memory input buffer to the flip-flop circuit of the memory device. In this case, the setup/hold time is actually measured including the difference in input timing between the external input pins for clock and input signals, that is, the skew ascribable to the physical difference between the transfer routes of the clock and the input signals. This time measurement did not correctly reflect the memory characteristics.

Japanese patent laid-open publication Nos. 264675/1993 and 2002-162444 deal with, as described above, measuring the time free from delay but the problem totally different from measuring the time free from. Japanese patent laid-open publication No. 174121/1999 discloses the bypass test mode indeed, and is silent about measurement of time free from delay described above.

SUMMARY OF THE INVENTION

It is an object of the present invention to provide a semiconductor device allowing correct measurement of time not containing substantial delay.

The present invention provides a semiconductor device comprising a first circuit for performing a first function and a second circuit arranged in front of said first circuit for performing a second function. In the semiconductor device, there are provided an ordinary mode for receiving an input signal from outside to said semiconductor device and for outputting an output signal to outside from said semiconductor device to perform functions responsive to the input and output signal, and a test mode for measuring characteristics of the input signal and the output signal in said semiconductor device. There are formed an ordinary input/output path for allowing the input and output signals to flow therethrough in the ordinary mode, and a test input/output path for bypassing the ordinary input/output path in the test mode to allow the input and output signals to flow directly to said first circuit. The semiconductor device further comprises a switcher for switching each of the input and output signals to the ordinary input/output path or the test input/output path. The first circuit includes an input/output circuit for receiving or outputting the input and output signals flowing on the ordinary and test input/output paths. The input/output circuit includes an input/output selector for using a test clock signal directly supplied in the test mode to selectively take in a signal associated with each of the input and output signals to output the signal taken in.

In accordance with a semiconductor device of the present invention, an input/output path for test is provided, and the first circuit has an input/output unit including an input/output selector. A test clock signal directly supplied in the test mode is used to selectively take in a signal associated with the input and output signals to output a resultant signal thus taken in. The output signal is monitored on the external pins, while changing the timing of the positive-going edge of the clock or input signals to relatively measure a delay amount indicating to which degree the phase shift due to delay has been caused immediately before input and after output of the first circuit. Correction is made by subtracting a measurement value resultant from using the test clock signal from a measurement value obtained using the ordinary clock signal for accurate measurement of parameters or signal characteristics of the first circuit, such as the setup/hold time and the access time of the memory device itself.

BRIEF DESCRIPTION OF THE DRAWINGS

The objects and features of the present invention will become more apparent from consideration of the following detailed description taken in conjunction with the accompanying drawings in which:

FIG. 4 is a timing chart useful for understanding the phase offset of the clock signal in the input/output selector with the test function shown in FIG. 3;

FIG. 5 is a timing chart, like FIG. 4, useful for understanding the phase offset of the input signal in the input/output selector with the test function;

FIG. 6 is a timing chart useful for understanding the phase offset of the output signal in the input/output selector with the test function;

DESCRIPTION OF THE PREFERRED EMBODIMENTS

Figure 1:
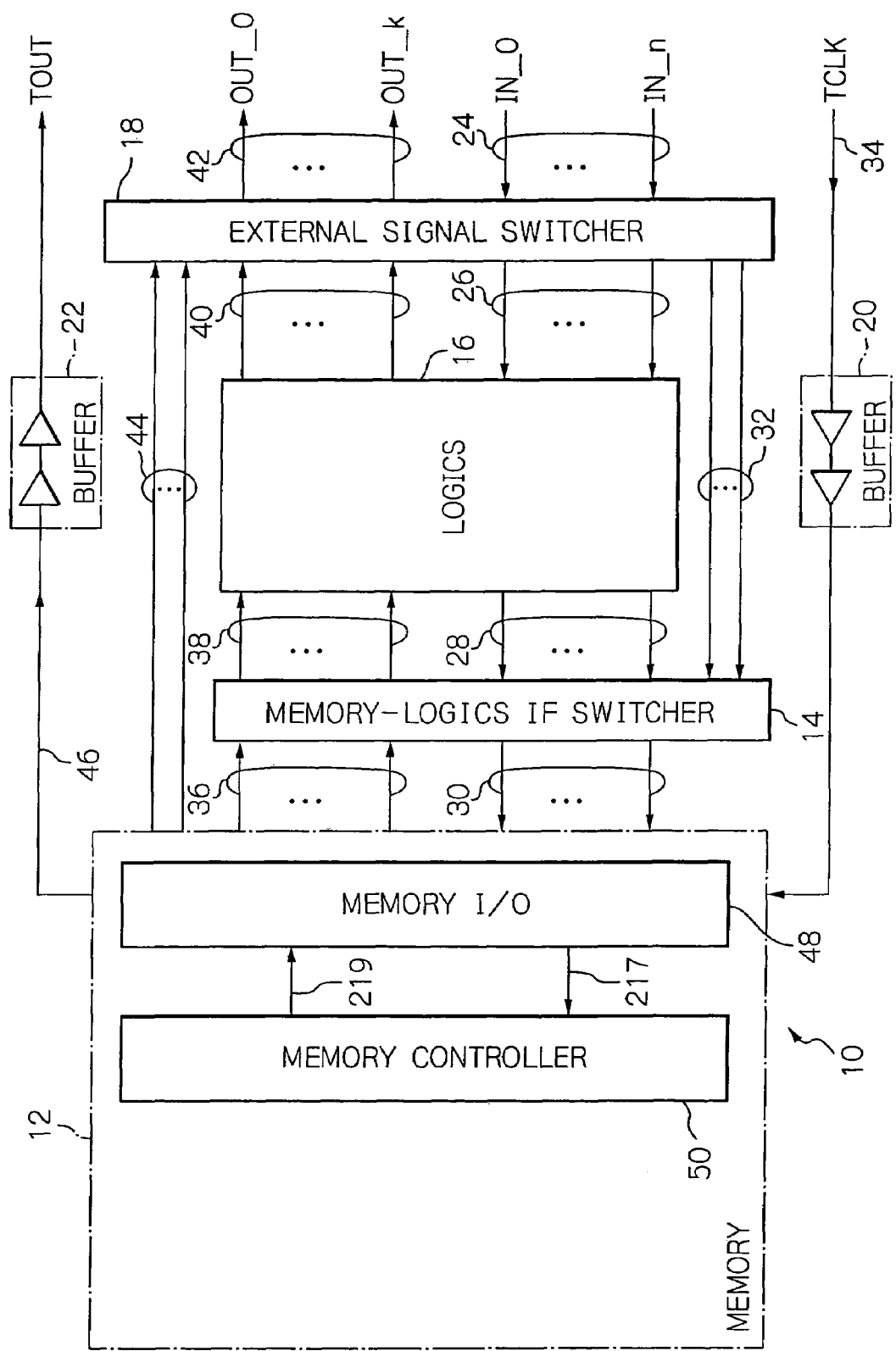
FIG. 1 is a block diagram showing a schematic configuration of a memory-logics LSI device to which applied is a semiconductor device according to the present invention.

Referring to the drawings, preferred embodiments of the semiconductor device will be described in detail. The embodiments are directed to a memory-logics LSI (Large Scale Integration) device 10, having a testing device embodying the semiconductor device according to the present invention. The parts or components not directly relevant to understanding the present invention are not shown nor illustrated for simplicity.

Referring to FIG. 1, the LSI device 10 includes a memory device 12, a memory-logics interface (IF) switcher 14, logics 16, an external signal switcher 18, and buffers 20 and 22 which are interconnected as illustrated. In the instant embodiment, the memory device 12 implements one function, and the logics 16 implement the other function. Referring to the figure, the interconnections of those constituent elements of the LSI device 10 will be described briefly. On the input side of the LSI device 10, an external input path 24 extends from external input pins, not shown, and is connected to the external signal switcher 18. The external input path 24 is adapted to receive, for example, plural (n+1) input signals IN_0 to IN_n, where n is a natural. In the description, signals are denoted with the reference numerals of connections on which they are conveyed.

The external signal switcher 18 is connected by a logic input path 26 to the logics 16. The logics 16 are connected by a memory input path 30 to a memory-logics interface switcher 14. The memory-logics interface switcher 14 is connected by the memory input path 30 to the memory or storage device 12.

The external signal switcher 18 is also connected by a memory direct test input path 32 to the memory-logics interface switcher 14 so as to allow an input signal to be directly supplied, when testing, to the memory-logics interface switcher 14 without the intermediary of the logics 16.

In the instant embodiment, a test clock signal, TCLK, 34 is supplied via a buffer 20 to the memory device 12, without passing the external signal switcher 18, logics 16 and memory-logics interface switcher 14.

On the output side of the LSI device 10, the memory device 12 is connected by a memory output path 36 to the memory-logics interface switcher 14. The memory-logics interface switcher 14 is connected by a logic input path 38 to the logics 16. The logics 16 are connected by a logic output path 40 to the external signal switcher 18. The external signal switcher 18 is connected by an external output path 42 to external output pins, not shown. The external output path 42 outputs e.g. plural (k+1) output signals OUT_0 to OUT_k, where k is a natural number.

The memory device 12 is also connected by a memory direct test path 44 directly to the external signal switcher 18 so as to allow signals to be directly supplied to the external signal switcher 18 bypassing the memory-logics interface switcher 14 and the logics 16. Further with the present embodiment, a memory test output signal, TOUT_M, 46 is supplied via a buffer 22 to an external output pin, not shown.

In respect of the interconnections described above, the present embodiment is specifically characterized in that the test clock signal, TCLK, 34 is directly entered to the memory device 12, the test output signal, TOUT, 46 is directly output from the memory device 12, and in addition to an output DO of the memory device 12 the test output signal, TDO, 44 is provided, the output data being entered to the external signal switcher 18 without being routed through the memory-logics interface switcher 14 and the logics 16.

The constituent elements, shown in FIG. 1, will now be described briefly. The memory device 12 basically has the functions of storing and temporarily holding data supplied and outputting the data temporarily held therein, and of promptly receiving and outputting the data. For accomplishing the functions, the memory device 12 further includes a memory input/output (I/O) unit 48 and a memory controller 50 as illustrated. The memory input/output unit 48 will be described further subsequently. The memory controller 50 includes the ordinary functions for controlling the storage unit, not shown, of the memory device 12.

The memory-logics interface switcher 14 has the function of allowing an input signal and an output signal, transferred between the memory device 12 and the logics 16, to be input or output on the logic output path 28, memory output path 36, memory input path 30 and logic input path 38. The memory-logics interface switcher 14 also has the function of supplying a signal, received on the memory direct test input path 32, to the memory device 12.

The logics 16 have the function of performing logical operations on the signals supplied from the logic input paths 26 and 38 to output a signal resultant from the operations on the logic output paths 28 and 40 to the memory-logics interface switcher 14 and the external signal switcher 18.

The external signal switcher 18 has, as its input side functions, the functions of receiving (n+1) input signals, during the normal operations to output the signals to the logics 16, and of switching the signal, supplied during testing, to the memory direct test input path 32 to send these signals to the memory-logics interface switcher 14. The external signal switcher 18 also has, as its output side functions, the functions of being supplied with (k+1) input signals, during the normal operations to output the signals to outside, and of switching the signals from the memory direct test path 44 to output these signals to outside.

The buffers 20 and 22 each have the function of enhancing the gain of the input signal and shaping the waveform thereof. In the illustrative embodiment, the buffers have two amplifier stages connected in tandem, not specifically shown.

Figure 2:
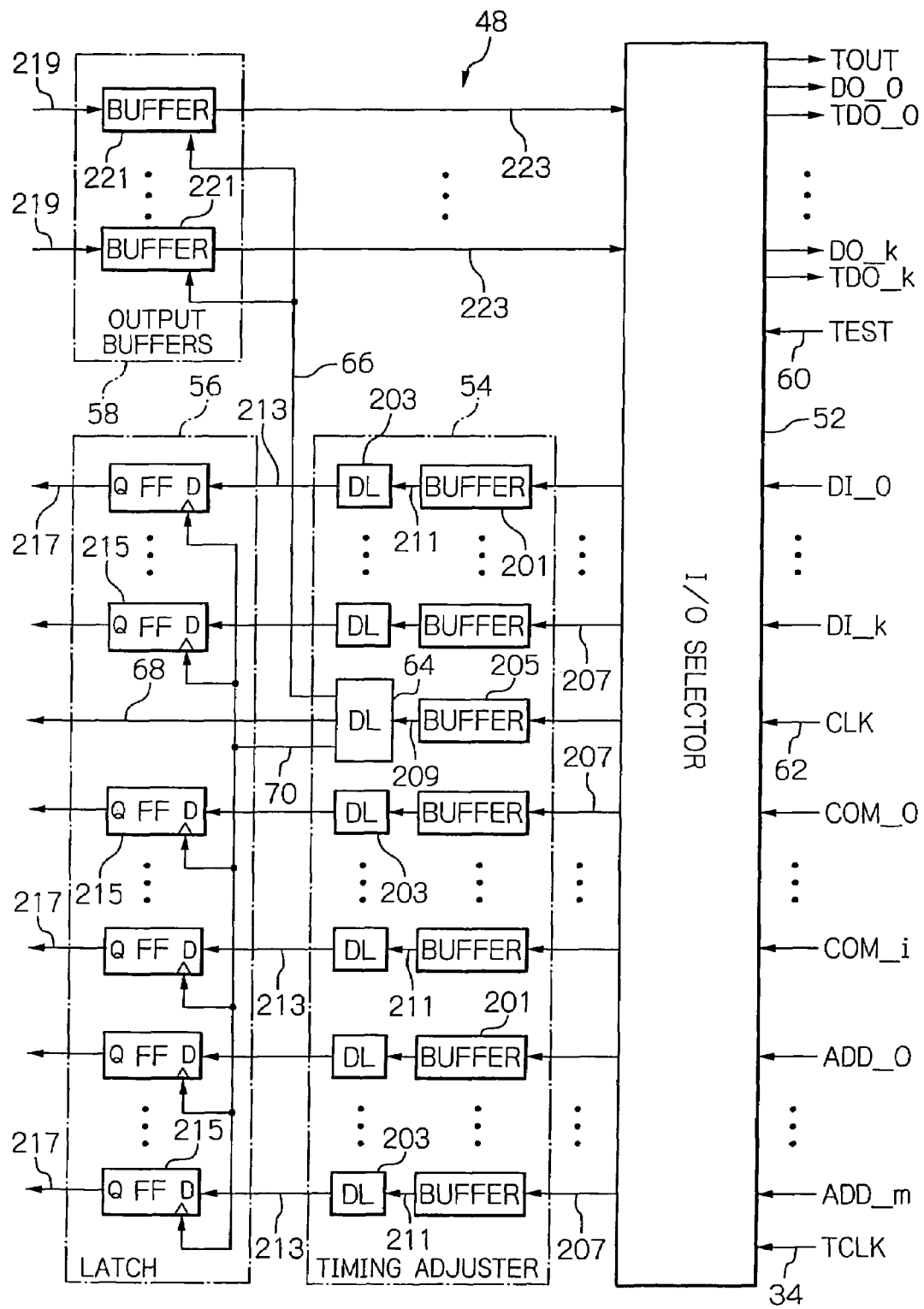
FIG. 2 is a circuit diagram showing a schematic configuration of the memory input/output unit in the memory-logics LSI device shown in FIG. 1.

The memory input/output unit 48, specific to the present invention, will now be described. With reference to FIG. 2, the memory input/output unit 48 includes an input/output selector with test function 52, a timing adjuster 54, a latch 56 and output buffers 58, which are interconnected as depicted. The input/output selector 52 has the function of measuring a relative delay between the output nodes and the output pins of the memory device 12 with respect to the timing of the positive-going edge of the test clock signal, TCLK, 34 supplied. The input/output selector 52 is supplied, as input signals, with a TEST signal 60 defining the test mode, DI signals from DI_0 to DI_k, a clock signal, CLK, 62, COM signals from COM_0 to COM_i, ADD signals from ADD_0 to ADD_m and the test clock signal, TCLK, 34. The DI signals are represented by DI_0 through DI_k, and hence will be denoted with a symbol DI<k:0>. Similarly, the COM signals extend from COM_0 to COM_i, and hence will be denoted by a symbol COM<i:0>, while the ADD signals being of ADD_0 through ADD_m, which will be denoted by a symbol ADD<m:0>.

The input/output selector 52 outputs, as output signals, the test output signal, TOUT, 46, D0 signals from DO_0 to DO_k and TDO signals from TDO_0 to TDO_k, to the external signal switcher 18. The more specified configuration of the input/output selector 52 will be described subsequently with reference to FIG. 3.

The timing adjuster 54 has the function of adjusting the timing of the input signals DI<k:0>, COM<i:0> and ADD<m:0>, supplied from the input/output selector 52 on connections 207. The timing adjuster 54 has sets of a buffer 201 and a delay device (DL) 203, each of which set is associated with one of these input signals 207. The buffers 201 have the function of shaping the waveform of the input signals 207, concomitantly with amplification, to output the thus shaped signals 211 to the delay devices 203 associated therewith. The delay devices 203 have the function of making the timing of outputting the supplied signals 211 coincide with that of the other signals.

The timing adjuster 54 has another delay device 64 and another buffer 205 interconnected to receive the clock signal, CLK, 62. The delay device 64 is adapted to delay the signal 209, supplied from the buffer 205, to output three clock signals 66, 68 and 70. The three clock signals 66, 68 and 70 are, respectively, a clock signal, OUT_CLK, supplied to the output buffers 58, the clock signal, CLK, supplied to the memory controller 50, and a clock signal, INP_CLK, supplied to flip-flop circuits 215 included in the latch 56. The timing adjuster 54 has its outputs 213 interconnected to the flip-flops 215 of the latch 56 to provide the latter with the output from the delay devices 203.

The latch 56 has the function of receiving the input signals 213 supplied thereto in timed with the clock signal 70, and temporarily holding them to output the signals 217. As briefly stated, a plural number of flip-flops 215 are provided in the latch 56. Each of the flip-flops 215 is adapted to receive appropriate one of the input signals DI<k:0>, COM<i:0> and ADD<m:0>, supplied on its input terminal D, to send the output signal 217 on its output terminal Q. Each of the flip-flops is provided with a clock signal, INP_CLK, 70, and takes in a signal and outputs the latter in timed with, e.g. the positive-going edge of the clock signal

70. The latch 56 outputs the input signals, DI<k:0>, COM<i:0> and ADD<m:0>, 217 to the memory controller 50.

The output buffers 58 have the function of amplifying the output signal 219 supplied thereto, and shaping the waveform thereof. In the output buffers 58, plural (k+1) buffers 221 are provided, as seen from the output signals denoted with DO<k:0>. Each of the buffers 221 operates responsively to the clock signal, OUT_CLK, 66. The output buffers 58 output the output signals, DO<k:0>, 223 to the input/output selector with test function 52.

Figure 3:
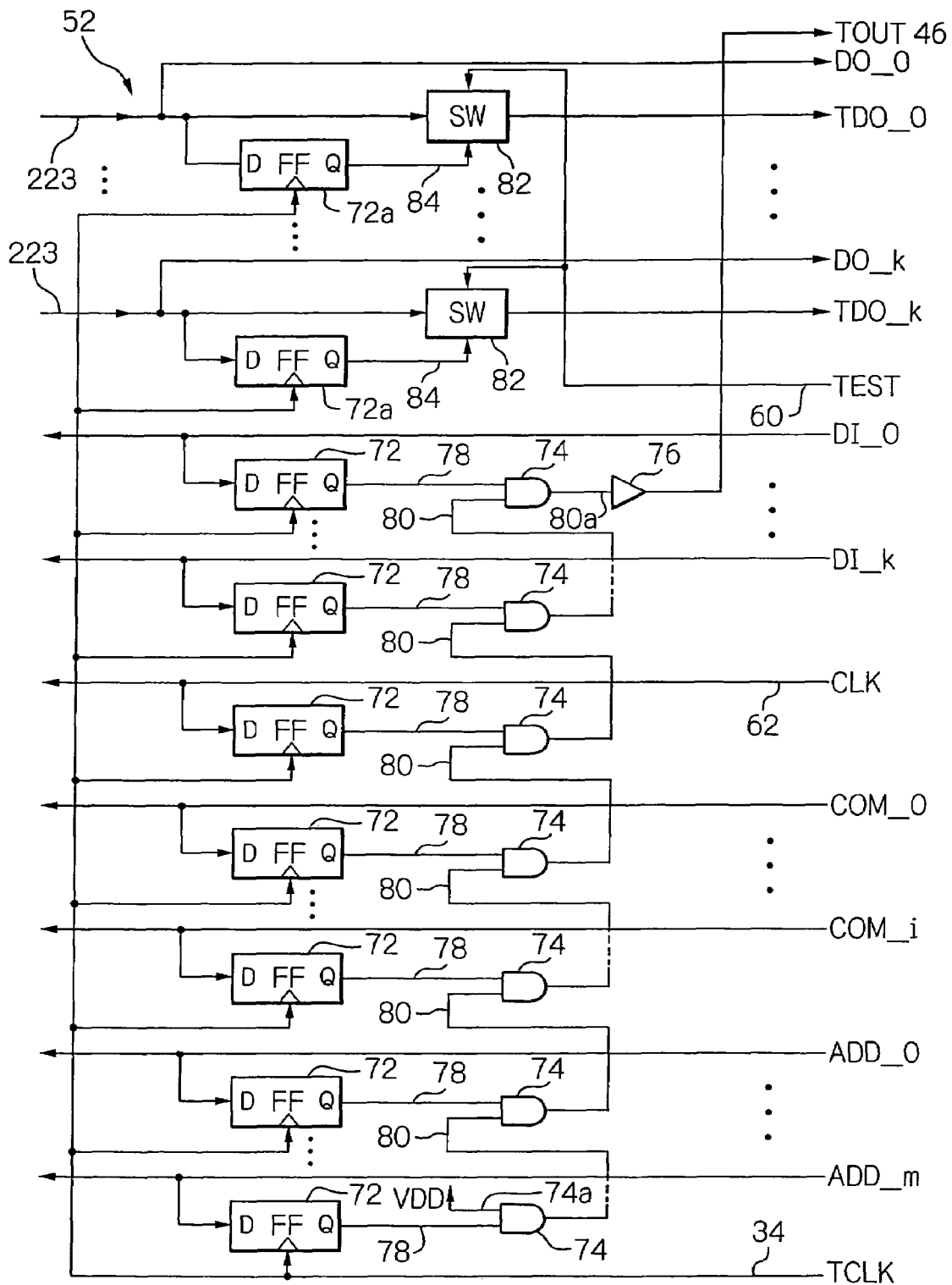
FIG. 3 is a schematic circuit diagram showing a specific circuit configuration of the input/output selector with test function shown in FIG. 2.

Well, referring to FIG. 3, the input/output selector 52 with test function specifically includes a number of sets of a flip-flop 72 and a logical product (AND) gate 74, which sets correspond to the input signals DI<k:0>, and clock signals, CLK, COM<i:0> and ADD<m:0>. The input/output selector 52 also includes a buffer 76 interconnected as shown in the figure. Basically, each of the flip-flops 72 is adapted to take in the input signal on its input terminal D to send an output signal 78 from its output terminal Q to one input port of the AND gate 74. The flip-flops 72 are supplied with the clock signal, TCLK, 34. More specifically, the flip-flops 72 take in the input signals in timed with the clock signal, TCLK, 34 to develop the output signals 78. Each of the AND gates 74 has its other input port 80 supplied with the output signal from the AND gate 74 in the preceding stage of the cascade. Specifically, each AND gate 74 is connected so that its one input port 78 is supplied with the output Q of the flip-flop 72 in the same state, and its other input port 80 is supplied with the output of the AND gate 74 in the stage preceding in the direction of logical signal. It is noted however that the AND gate 74 in the first stage has its one input port 78 connected to the output terminal Q of the flip-flop 72, whereas having its other input port 74*a* pulled up to, e.g. a high level H, as depicted with VDD in the figure. The AND gate 74 of the last stage is adapted to send an output signal 80*a* to the buffer 76. The buffer 76 produces the output signal, TOUT, 46. The AND gates 74, thus interconnected, carry out logical product operations on the output 78 of the flip-flop 72 and the output 78 which is cumulative of the output from the AND gates 74 thus cascaded. The AND gate 74 outputs the output signal, TOUT, 46 to the buffer 76.

On the data output side, basically, a set of a flip-flop 72*a* and a switcher 82 is provided in association with each output signal. Due to the output signal DO<k:0>, a plurality (k+1) of sets of the flip-flop 72*a* and the switcher 82 are disposed. Each of the flip-flops 72*a* takes in the output signal 223 from the associated buffer 221 of the output buffers 58 on its input terminal Din timed with the clock signal, CLK, 34, and transfers an output signal, TDO, 84 on its output terminal Q to a switcher (SW) 82 associated therewith in response to the clock signal 34.

The switcher 82 is of, e.g. a transfer gate adapted for producing the output signal, TDO, 84, depending on whether or not the current state is the test mode. Each of the switchers 82 is supplied with the output signal 223 from the associated buffer 221 of the output buffers 58 and with the output signal 84 of the associated flip-flop 72. The switcher 82 is adapted to select, depending on the level of a test signal, TEST, 60, specifying whether or not the current state is the test mode, which of the output 223 of the output buffers 58 and the output 84 is to be coupled to the signal port, TDO. The test signal, TEST, 60 may be generated within or outside the memory device, as desired.

The operation of the input/output selector 52 will now be described. As an example of the operation of the input/output selector 52, the case of measuring the phase shift of the clock signal, CLK, 62 with respect to the clock signal, TCLK, 34 and the follow-up characteristics thereof will now be described. The following description, concerning the timing, will be made on the memory test mode in which the external input/output pins are connected to the respective inputs/outputs of the memory device 12, without intermediary of the logics 16, the timing being defined at the external input/output pins, not shown.

The inputs other than the clock signal, CLK, 62, specifically, the signals DI<k:0>, COM<k:0> and ADD<m:0>, FIG. 4, lines (c), (d) and (e), respectively, take the high level "H" thereof applied from outside. In this setting, as shown in FIG. 4, one of the flip-flops 72, FIG. 3, which is to be supplied with the clock signal, CLK, 62, is provided with the clock signal, TCLK, 34, and takes in the input, TCLK, 62 in timed with the positive-going edge of the clock signal, TCLK, 34 to output the clock signal, TCLK, 62 to the input port 78 of the AND gate 74. The other input port of the AND gate 74 is supplied with the level "H" under the aforementioned condition setting.

The timing of the positive-going edge of the clock signal, CLK, is dependent upon the phase shift of the clock signal, CLK, 62. The output signal, TOUT, 46 is monitored. First, in respect of one of the flip-flops 72 which deals with the clock signal, CLK, 62, when the timing of the positive-going edge of the clock signal, CLK, 62 shown in FIG. 4, line (b) is sufficiently earlier than the timing of the positive-going edge of the clock signal, TCLK, 34 shown in FIG. 4, line (a), that flip-flop 72 takes in the level "H" of the clock signal, CLK, 62, to output the level "H" in synchronism with the positive-going edge of the clock signal, TCLK. Hence, when the output signal, TOUT, is monitored on the corresponding external pin, it will be observed that the level "H" of the output signal, TOUT, is developed in synchronism with the positive-going edge of the clock signal, TCLK.

Then, when the positive-going edge of the clock signal, CLK, 62 is made to approach in timing the positive-going edge of the clock signal, TCLK, the output signal, TOUT still maintains its level "H". If the positive-going edge of the clock signal, CLK, 62 is delayed in timing beyond the positive-going edge of the clock signal, TCLK, that flip-flop 72 handling the clock signal, CLK, 62 becomes unable to take in the level "H" of the clock signal, CLK, 62 at a certain timing, as a result of which that flip-flop 72 is fixed in its state "L" shown by a dotted line in FIG. 4, line (f). Thus, when the output signal, TOUT, 46 is monitored at the external pin, it is observed that the state of the output signal, TOUT, 46 remains unchanged at its level "L" even when the clock signal, TCLK, 34 goes positive. The input/output selector 52 in the memory input/output unit 48 measures, in synchronism with the positive-going edge of the clock signal TCLK, 34, the time difference, tCKSKEW, 86 between the clock signals, TCLK, 34 and CLK, 62 when the output signal, TOUT, ceases to take its level "H", to thereby enable the phase shift of the clock signal, CLK, 62 to be determined with respect to the clock signal, TCLK, 34.

Next, the description will be made on how the input/output selector with test function 52 the measures the phase shift of a clock signal, CLK, 62 with respect to the clock signal, TCLK, 34 and the follow-up characteristics thereof. In this case also, the signals other than the signal ADD<0>, of which the phase shift is to be measured, namely, the clock, CLK, input signal DI<k:0>, COM<i:0> and ADD<m:1>, shown in FIG. 5, lines (b) (c) (d) and (f), respectively, are fixed at the level "H" thereof, as in the case of the aforementioned clock signal, CLK, 62. In the input/output selector with test function 52, FIG. 3, one of the flip-flops 72 which handles the input signal ADD<0> takes in the input signal ADD<0> in response to the positive-going edge of the clock signal, TCLK, 34, to send out the corresponding output signal. At this time, the input signal ADD<0> supplied to that flip-flop 72 changes the timing of its positive-going edge. That flip-flop 72 produces the output signal synchronized with the positive-going edge of the clock signal, TCLK, 34. As a result, the output signal, TOUT, 46 corresponding to the input signal ADD<0> is monitored. The input/output selector 52 may thus measure, when the output signal, TOUT, synchronized with the positive-going edge of the clock signal, TCLK, 34 ceases to take its level "H", the time difference, tADSKEW, 88 between the clock signal, TCLK, and the input signal ADD<0>, to thereby find out the phase shift of the input signal ADD<0> with respect to the clock signal, TCLK.

In this manner, the input/output selector 52 can relatively measure the totality of the input signals on the phase shift of the signals with respect to the clock signal, TCLK, specifically, the signal delay amount between the input nodes of the memory device 12 and the external input pins with respect to the timing of the positive-going edge of the clock signal, TCLK, 34. The so measured values may be used for correction to correctly find out the setup/hold time of the signals input on the memory input/output unit 48, that is, the setup/hold time of the memory device 12. In the correction by the measured values, the phase shift of those input signals as found out with respect to the clock signal, TCLK, is converted into the phase shift of the input signals with respect to the clock signal, CLK, 62. This correction causes, in the case where the signal of interest is ADD<0>, for example, a value obtained on subtracting the time difference, tCKSKEW, 86 from the time difference, tADSKEW, 88 to be the phase shift of the signal ADD<0> in the memory input/output unit 48 with respect to the clock signal, CLK, 62, which means that the phase shift of each input signal with respect to the clock signal, CLK, 62 in the memory input/output unit 48 is subtracted from, or added to, the setup/hold time as measured in the usual operation without using the clock signal, TCLK.

Well, a description will be made on the measurement by the input/output selector 52 on the delay of the output signal, DO, with respect to the clock signal, TCLK, 34. The command COM<i:0> and the address ADD<m:0>, as input signals, not shown, are entered in synchronism with the clock signal, CLK, 62, shown in FIG. 6, line (a), to set the state where desired data may be read out from a desired address location.

In the present embodiment, the timing of the positive-going edge of the clock signal, TCLK, 34, shown in FIG. 6, line (b), is changed with respect to that of the positive-going edge of the clock signal, CLK, 62. For measurement, the output signal TDO<k:0>, sent out in response to this change, is monitored as the output signal OUT<k:0>. For this measurement, the switcher 82, shown in FIG. 3, is connected such as to receive on its input ports the output signal, DO, in the form of signal 223 from the memory device 12 and the output signal 84 from the flip-flop 72a. The switcher 82 selectively outputs one of these signals 223 and 84 responsively to the test signal, TEST, 60.

When the clock signal, TCLK, 34, FIG. 6, line (b), goes positive at a timing to delayed enough from the timing at which the output signal DO from the output buffers 58 is settled in response to the positive-going edge of the clock signal, CLK, 62, FIG. 6, line (a), the output side flip-flops 72a take in the output data D<k:0> already settled, shown shaded in lines (c), (d) and (e) of the figure. The flip-flops 72a output data of the same logical state as the output data thus settled in synchronism with the positive-going edge of the clock signal, TCLK, 34.

If the output data in its final settled state are of the level "H", for example, the external pins, not shown, develop the output signals TDO<k:0> as shown in FIG. 6, lines (f) and (h), other than the output signal TDO<1> shown in line (g), in synchronism with the positive-going edge of the clock signal, TCLK, 34, such that the same logic level "H" as that of the settled output data is observed or measured. It is observed on the external pins whether or not the level "H" of the output signal or data ceases to be output which is set to its settled state in synchronism with the positive-going edge of the clock signal, TCLK, at the timing t0 of the positive-going edge. In this case, a time difference, tDDL_1, 90, is measured between the clock signals, CLK, 62 and CLK, 34 with the phase shift.

Then, the timing of the positive-going edge of the test clock signal, TCLK, 34 is made approach the timing of the positive-going edge of the clock signal, CLK, 62. Specifically, the timing is made earlier than the aforementioned timing t0 so that, at a timing t1 of the positive-going edge of the test clock signal, TCLK, 34, the flip-flops 72a take in the output data DO<k:0>, shown in FIG. 6, lines (c), (d) and (e). At this time instant, the flip-flops 72a become unable to take in the level "H" of the output signal DO<0> as its settled state. The result is that, of the output signals TDO<k:0>, not only the output signal TDO<1>, FIG. 6, line (j), relating to line (f) but also the output signal TDO<0>, line (i), ceases to take the level "H" thereof to output an output signal TDO<k>, shown in line (k). Thus, viewing on the external pins, even when it is attempted to take in the output data at the timing of the positive-going edge of the clock signal, CLK, 62, the level "H" of the output signal TDO<1:0> cannot be obtained.

It is then observed on the external pins whether or not the level "H" ceases to be taken of the output signal or data, when settled, in synchronism with the positive-going edge of the clock signal, TCLK, 34 at the timing of the positive-going edge of t1. As in the above-described case, the time difference, tDDL_0, 92 is measured between the clock signals, CLK, 62 and TCLK, 34 with the phase shifted.

Further, the timing of the positive-going edge of the clock signal, TCLK, 34 is made shifted to a timing t2. Thus, as shown in FIG. 6, lines (l), (m) and (n), all of the output signals TDO<k:0> ceases to take the level "H" thereof. In this case, the time difference, tDDL_k, 94 for the output signal TDO<k> is measured between the clock signals, CLK, 62 and TCLK, 34 with the d phase shifted.

In this manner, the input/output selector 52 of the memory input/output unit 48 may relatively measure the delay of the output signal, DO, with respect to the clock signal, TCLK, 34, namely, the delay between the signals at the output nodes of the memory device 12 and the external input pins with respect to the timing of the positive-going edge of the clock signal, TCLK, 34. The so measured values may be used for correction to correctly find out the access time of the respective output signals at the memory input/output unit 48, in other words, the access time of the memory device 12. The correction by the measured values means that, since the delay between the clock signal entered on an external input pin and the clock signal, CLK, 62 in the memory input/output unit 48 has been determined as the time difference, tCKSKEW, with respect to the clock signal, TCLK, when measuring the setup/hold time correction, the time difference, tCKSKEW, is to be subtracted from, or added to, each of the currently measured time differences, tDDL_0 through tDDL_k.

The signals, output in the memory test mode, is switched so as to be monitored on the external pins to change the timing of the positive-going edge of the clock signal, CLK, 62 or the test clock signal, TCLK, 34, to measure the output from the flip-flops. That renders it possible to relatively measure to how much degree the input and output signals are offset on the respective input and output nodes of the memory device 12 with respect to the test clock signal, TCLK, 34, in other words, the signal delay between the respective input and output nodes of the memory device 12 and the external input and output pins. That facilitates the setup/hold and access periods of time of the memory device 12 may be calculated more accurately.

An alternative embodiment of the LSI device 10, employing the semiconductor device will now be described according to the present invention. In the alternative embodiment, the parts or components common to those of the embodiment previously described will be designated with the same reference numerals as those of the previous embodiment, and description on these parts or components is not made for simplicity.

The alternative embodiment may mainly be the same as the previous embodiment except that, instead of the flip-flops for measurement provided in the input/output selector 52, the flip-flops adapted for taking in the input signals and included in the latch 56 of the memory device 12 are additionally provided with the function of switching between the take-in clocks and the input data, thus measuring the phase shift of the respective input signals in the memory input/output unit 48 from the clock signal, TCLK, 34.

Figure 7:
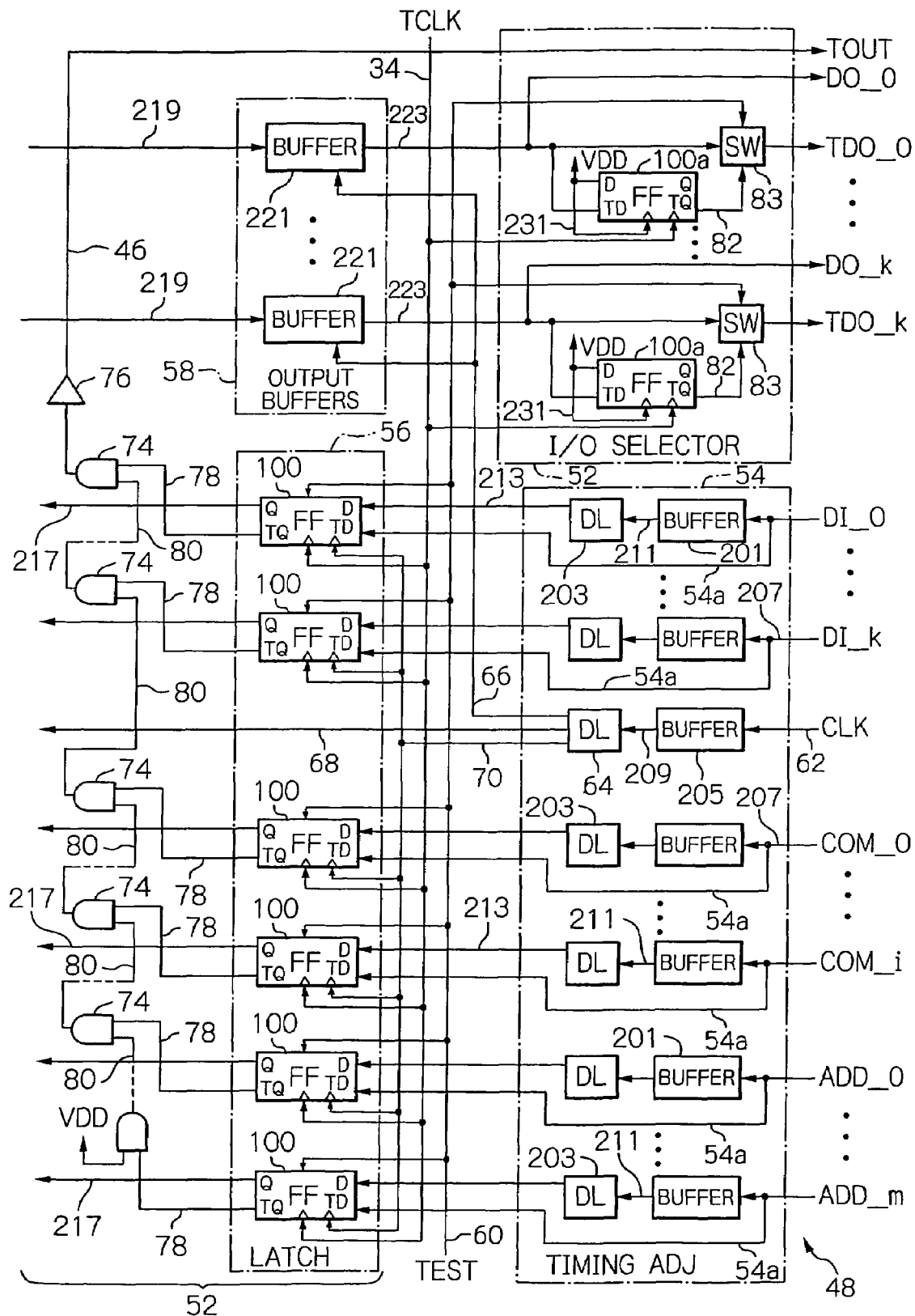
FIG. 7 is a schematic circuit diagram showing the configuration of the memory input/output unit in the memory-logics LSI device of an alternative embodiment of the semiconductor device according to the present invention.

For accomplishing this function, the timing adjuster 54 is connected, as shown in FIG. 7, such that the input signals DI<k:0>, COM<i:0> and ADD<m:0>, excluding the clock signal, CLK, 62, are received by the buffers 201, and a signal line 54a, bypassing the timing adjuster 54, is additionally provided to route the input signals DI<k:0>, COM<i:0>, and ADD<m:0> to the latch 56.

The latch 56 is a component of the input/output selector 52, as described above. The latch 56 and the input/output selector 52 are provided with flip-flops 100 and 100a, which are different from the corresponding flip-flops 215 and 72a, respectively, shown in FIGS. 2 and 3 in that an additional function is newly included. The flip-flops 100 and 100a are connected so as to be supplied with the test signal, TEST, 60, the clock signal, TCLK, 34 and the clock signal, INP_CLK, 70 for control purposes. The flip-flops 100 on the input side thereof are supplied with a timing-adjusted input signal and a timing unadjusted input signal on the input terminals D and TD thereof, respectively, and adapted to output on the output side the signal 217 on the output terminal Q thereof and the other signal 78 on the output terminal TQ thereof, respectively, to the memory controller 50 and the one input port of the AND gates 74, respectively. Each of the AND gates 74 is connected so that the output 80 from the AND gate 74 of the preceding stage will be supplied at its other input port. The AND gates 74 are of course equivalent to the AND gates 74 shown in FIG. 3.

The flip-flops 100a, arranged on the output side of the input/output selector 52, have the input terminal D and the terminal 231 which is otherwise to be supplied with a clock signal, INP_CLK, 70 pulled up to the power supply voltage VDD in order that the flip-flops 100a will operate similarly to the flip-flops 72a of the illustrative embodiment described earlier.

Figure 8:
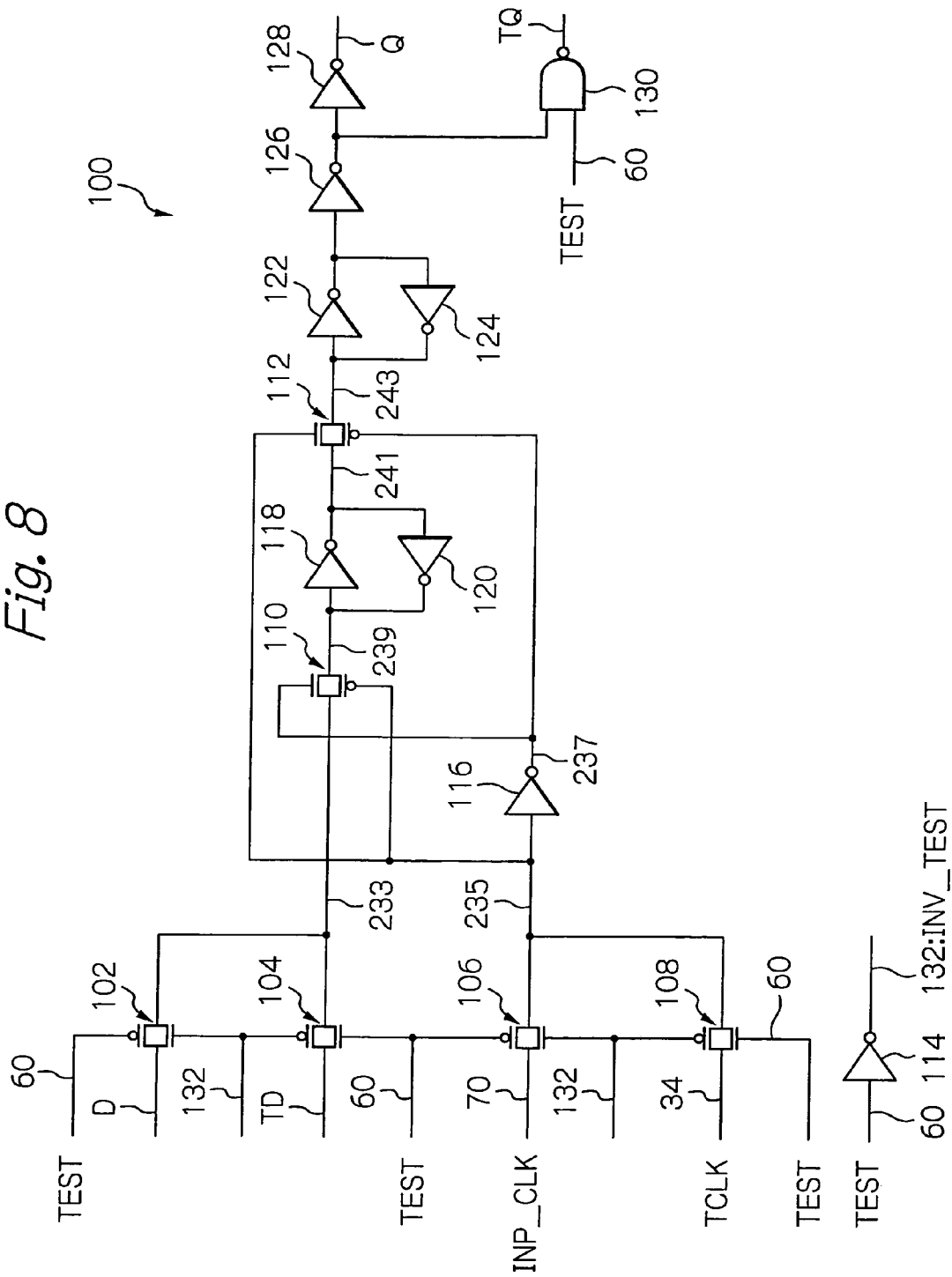
FIG. 8 is a schematic circuit diagram showing a specific configuration of the flip-flop circuit shown in FIG. 7.

FIG. 8 shows an illustrative configuration of the flip-flop 100 used on the input side of the memory input/output unit 48. The flip-flop 100 includes transfer gates 102 to 112, inverters 114 to 128 and an inverting logical product, NAND, gate 130. The connection in the flip-flop 100 will now be described. The transfer gate 102 has its inverting terminal 60 supplied the test signal, TEST. The transfer gate 102 has its non-inverting terminal 132 connected in common to the inverting terminal of the transfer gate 104 to be supplied with an inverted test signal, INV_TEST. The inverted test signal, INV_TEST, 132 is generated by inverting the test signal, TEST, 60 by the inverter 114. To the input terminal D, the transfer gate 102 is connected to receive the input signal or data.

The transfer gate 104 has its non-inverting terminal 60 interconnected in common to the inverting terminal of the transfer gate 106 supplied with the test signal, TEST. To the input terminal TD, the transfer gate 104 is connected to receive the non-timing-adjusted input signal. The transfer gate 106 has its non-inverting terminal 132 commonly interconnected to the inverting terminal of the transfer gate 108 to receive the inverted test signal, INV_TEST. The transfer gate 106 has its input terminal 70 connected to the clock terminal supplied with the clock signal, INP_CLK, 70. The transfer gate 108 has its non-inverting terminal 60 supplied with the test signal, TEST. The transfer gate 108 has its input terminal 34, acting as a clock terminal, supplied with the clock signal, TCLK.

The transfer gates 102 and 104 have the output terminals 233 connected in common to each other and further to the input terminal of the transfer gate 110. This connection is expressed as a connection to an internal node D_I. The transfer gates 102 and 104 have the output terminals 235 thereof connected in common to each other and further to the inverting terminal of the transfer gate 110, the non-inverting terminal of the transfer gate 112 and the input terminal of the inverter 116 as depicted in the figure. This connection is expressed as a connection to an internal node CLK_I. The inverter 116 has its output port 237 connected to the non-inverting terminal of the transfer gate 110 and the inverting terminal of the transfer gate 112. Between the output terminal 239 of the transfer gate 110 and the input terminal 241 of the transfer gate 112, the inverter 118 is arranged. The inverter 118 has its output port 241 connected via the inverter 120 to its input port 239.

The transfer gate 112 is connected so that its output 243 is supplied to the inverter 122, which has its output connected to the inverters 124 and 126 as illustrated. The inverter 124 has its output fed back to the input terminal 243 of the inverter 122. The inverter 126 is connected to the inverter 128 and one input port of the inverting AND gate 130 as illustrated. The inverter 128 produces the output signal or data on its output terminal Q. The inverting AND gate 130 has its other input port 60 supplied with the test signal, TEST, and produces the result of the inverted logical product as an output signal or data on its output terminal TQ.

These transfer gates 102, 104, 106 and 108 are controlled in response to the test signal TEST 60 and the inverted test signal, INV_TEST, 132, and adapted to select the input data and the clock signal to be taken in, depending upon the logical state of the test signal. The flip-flop 100 is also adapted to produce the output terminal TQ such that, depending on the logical state of the test signal, the output of the inverting AND gate 130 will be fixed at its level "H".

The operation of the flip-flop 100 will now be described briefly. During the normal operation, the test signal, TEST, 60 takes its level "L", which renders the transfer gates 102 and 106 in the conducting state thereof. Hence, the flip-flop 100 receives the input signal or data having passed the buffers 201 and the delay devices 203 of the timing adjuster 54 in timed with the clock signal, INP_CLK, 70.

On the other hand, when measuring the phase shift of each of the clock signal, TCLK, 34 and the input signal in the memory input/output unit 48, the test signal, TEST, 60 is rendered to its level "H", thus the transfer gates 104 and 108, FIG. 8, taking the conductive state thereof. The flip-flops 100 are supplied with the input signal entered to the memory device 12 bypassing the buffers 201 and the delay devices 203 of the timing adjuster 54, and are taken in in timed with the test clock signal, TCLK, 34. The memory input/output unit 48 will proceed to measuring the phase shift of the clock signal, TCLK, 34 and the respective input signals in the same way as in the previous embodiment.

Thus, in place of the flip-flops provided on the input side for phase measurement in the input/output selector 52 with the embodiment described with reference to FIGS. 1, 2 and 3, the flip-flops 100 are provided which have, in addition to the function of switching the clock signal to be taken into the flip-flops 72 for use in taking in the input signals into the memory device, the function of switching the input signal. The memory input/output unit 48 is conjointly provided with the two functions, namely the functions of taking in the input signal into the memory device 12 and of measuring the phase shift of each of the input signals with respect to the clock signal, TCLK, 34. It is therefore possible to suppress the size of a semiconductor chip of the LSI device from increasing and to attain the advantages similar to those of the illustrative embodiment described with reference to FIGS. 1, 2 and 3.

The configuration described above allows the input/output path for testing to be formed, the input/output selector with test function 52 to be provided in the memory input/output unit 48 included in the memory device 12, and the clock signal, TCLK, 34 directly supplied in the test mode to be used to selectively take in one of the signals corresponding to the input signals DI<k:0>, COM<i:0> and ADD<m:0> to output the output signal DO<k:0> thus taken in. While the output is monitored on the external pins, not shown, the timing of the positive-going edges of the clock signal, CLK, 62 or the input signals DI<k:0>, COM<i:0> and ADD<m:0> are changed or adjusted, and a relative measurement is then made to obtain the amount of delay indicating the measure of the delay and a consequent phase shift encountered with respect to the clock signal, TCLK, 34 at the timings immediately before and after the input to the memory device 12. Then, correction is made by subtracting a measurement value obtained using the clock signal, TCLK, 34 from a measurement value, or time, obtained through the measurement not employing the clock signal, TCLK, for accurate measurement of the setup/hold time and access time of, e.g. the memory device 12 per se.

The input/output selector with test function 52 includes sets of the flip-flop 72 and the AND gate 74 each for one input signal on its input side processing. Each of the flip-flops 72 takes in one of the input signals, CLK, 62, DI<k:0>, COM<i:0> and ADD<m:0> supplied at the timing at which the clock signal, TCLK, 34 shifts its signal level. One of the input signals, CLK, 62, DI<k:0>, COM<i:0> and ADD<m:0>, thus taken in, is sent to one input port of the dual-input AND gate 74. The AND gate 74 has its output coupled to the other input port of the AND gate 74 of the set in the following stage. This next stage set has its output coupled to the other input port of the AND gate 74 of the set of the further following stage, and so forth to form a cascaded connection. The flip-flop 72 of the first set has its output connected to one input of the AND gate 74, which has its other input port supplied with a signal which renders its logical level high. The AND operation is then performed on these input signals. The following AND gates 74 have the other input port thereof supplied with the output signal from correspondingly preceding one of the AND gates. A signal output from the AND gate 74 in the last stage is connected to the buffer 76, which amplifies it to output.

The input/output selector 52 includes, as its output side processing, plural sets of the flip-flop 72a and the switch 82, each of the sets being provided for one output signal. Each of the flip-flops 72a takes in an output signal supplied at the timing at which the test clock signal, TCLK, 34, changes its level to issue the so taken-in output signal. The switcher 82 selects an output signal supplied from the output buffers 58 or the output of the flip-flop 72 in response to the input of the test signal, TEST, 60, to output the so selected signal. It is thus possible to acquire the information on how much degree the delay causes the shift immediately before input to and after output from the memory device 12.

Moreover, the input/output selector 52 is arranged in front of the timing adjuster 54, whereby it is possible to acquire a measurement value representing a relative offset caused by the delay with respect to each of the input signals, CLK, 62, DI<k:0>, COM<i:0> and ADD<m:0>.

In the input/output selector with test function 52, the latch 56 disposed as a post-stage of the timing adjuster 54 is additionally provided with a new function on its input side processing. Specifically, each of the flip-flops 100 of the latch 56 is combined with one of the AND gates 74 to form a set for one of the input signals, thus displaying the functions similar to those of the previous embodiment described earlier.

It is noted that, for affording this new function, each of the flip-flops 100 of the latch 56 is supplied with one of the input signals, CLK, 62, DI<k:0>, COM<i:0> and ADD<m:0>, adjusted in timing and output from the timing adjuster 54, one of the input signals, CLK, 62, DI<k:0>, COM<i:0> and ADD<m:0>, bypassing the timing adjuster 54, and the clock signals, CLK, 62 and, TCLK, 34 and the test signal, TEST, 60 which are used in the ordinary operating mode. In response to the test signal, TEST, 60 input, one of the clock signals, CLK, 62 and TCLK, 34 is used, depending on which the current operative mode is, to take in one of the input signals supplied in timed with the level transition of the clock signal to output the input signal thus captured to an output destination appropriate for the mode. The flip-flops 100 issue the output in the memory test mode to the one input port of the AND gates 74. Each of the dual-input AND gates 74 has its other input port coupled to the output signal of the AND gate 74 in the preceding stage so that the AND gates 74 are connected together in a cascaded fashion. In the AND gates 74 thus cascaded, the connections in the first and final sets are similar to those described above, and the configuration of accomplishing the output side processing is similar in employing the flip-flops 100 and the switcher 82.

The flip-flops 100 are thus included in the latch 56, and the new functions are incorporated, i.e. the functions of switching the clock signals to be taken into the flip-flops 100 and the input signals. The two functions are conjointly employed of taking in the input signal to the memory device 12 and measuring the phase shift of the clock signal, TCLK, 34 with respect to each of the input signals. It is thereby possible to suppress the size of a semiconductor chip of the LSI device from increasing and to accomplish the same functions as those of the previous embodiment.

The entire disclosure of Japanese patent application No. 2004-369206 filed on Dec. 21, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor device comprising a first circuit for performing a first function and a second circuit connected with input and output terminals of said first circuit for performing a second function, wherein
said semiconductor device is operative in a normal mode for receiving an input signal from outside to said semiconductor device and for outputting an output signal to outside from said semiconductor device to perform functions responsive to the input and output signal, and a test mode for measuring characteristics of the input signal and the output signal in said semiconductor device,
said semiconductor device comprising:
a normal input/output path for allowing the input and output signals to flow therethrough in the normal mode, and a test input/output path for bypassing the normal input/output path in the test mode to allow the input and output signals to flow directly to said first circuit; and
a switcher for switching each of the input and output signals to the normal input/output path or the test input/output path,
said first circuit including an input/output circuit for receiving or outputting the input and output signals flowing on the normal and test input/output paths,
said input/output circuit including an input/output selector for using a test clock signal directly supplied during the test mode to selectively take in a signal associated with each of the input and output signals to output the signal,
wherein said input/output selector comprises sets of a first information holding circuit and a logical product circuit respectively provided for the input signals,
said first information holding circuit taking in one of the input signals supplied at a transition timing at which the test clock signal shifts a level to output the signal,
said logical product circuit performing a logical product on two inputs to output a resulting logical product, each of said logical product circuits having an output connected to an input port of said logical product circuit of one of the sets which follows thereto to form a cascaded connection,
said logical product circuit of first one of the sets being supplied on a first input port of the two inputs with an output of said first information holding circuit as a piece of information, and on a second input port of the two inputs with a signal which renders a logical level high, said logical product circuit performing logical product operation on the two inputs,
said logical product circuits of the sets following the first set being supplied on the first input port to receive an output from said logical product circuit of one of the sets which precedes thereto, and on the second input port of the two inputs with the output of said first information holding circuit;
said logical product circuit in final one of the sets being connected to an amplifier for amplifying a signal output from said logical product circuit in the final set,
said input/output selector further comprising sets of a second information holding circuit and a signal selector respectively provided for the output signals,
said second information holding circuit taking in an output signal supplied at the transition timing to output the output signal,
said signal selector selecting the output signal supplied or the output signal of said second information holding circuit in response to the test mode.

2. The semiconductor device in accordance with claim 1, further comprising a timing adjuster having delay devices for adjusting a timing in outputting each of the input signals with corresponding one of the delay devices, said input/output selector being connected with input terminals of said timing adjuster.

3. A semiconductor device comprising a first circuit for performing a first function and a second circuit connected with input and output terminals of said first circuit for performing a second function, wherein
said semiconductor device is operative in a normal mode for receiving an input signal from outside to said semiconductor device and for outputting an output signal to outside from said semiconductor device to perform functions responsive to the input and output signal, and a test mode for measuring characteristics of the input signal and the output signal in said semiconductor device,
said semiconductor device comprising:
a normal input/output path for allowing the input and output signals to flow therethrough in the normal mode, and a test input/output path for bypassing the normal input/output path in the test mode to allow the input and output signals to flow directly to said first circuit; and
a switcher for switching each of the input and output signals to the normal input/output path or the test input/output path,
said first circuit including an input/output circuit for receiving or outputting the input and output signals flowing on the normal and test input/output paths,
said input/output circuit including an input/output selector for using a test clock signal directly supplied during the test mode to selectively take in a signal associated with each of the input and output signals to output the signal,
said semiconductor device further comprising a timing adjuster having delay devices for adjusting a timing in outputting of each of the input signals with corresponding one of the delay devices, and a latch having an additional function added and arranged after said timing adjuster,
said latch comprising sets of a first information holding circuit and a logical product circuit respectively provided for the input signals,
each of said first information holding circuits being supplied, for affording the added function, with a timing-adjusted input signal output from said timing adjuster for one of the input signals, an input signal by-passing said timing adjuster, a normal mode clock signal used in the normal mode, the test clock signal and a mode signal specifying the test mode, using either one of the normal mode clock signal and the test clock signal depending on whether a current mode is the normal mode or the test mode to take in one of the input signals which is supplied with the transition timing at which the clock signal used shifts a level to output the signal taken in to an output destination appropriate for the current mode;

said logical product circuit performing a logical product on two inputs to output a resultant logical product, each of said logical product circuits having an output connected to an input port of said logical product circuit of one of the sets which follows thereto to form a cascaded connection, said logical product circuit of first one of the sets being supplied on a first input port of the two inputs as an output destination in the test mode from said first information holding circuit as a piece of information, and on a second input port of the two inputs with a signal which renders a logical level high, said logical product circuit performing logical product operation on the two inputs, said logical product circuits of the sets following the first set being supplied on the first input port to receive an output from said logical product circuit of one of the sets which precedes thereto, and on the second input port of the two inputs with the output of said first information holding circuit;

said logical product circuit in final one of the sets being connected to an amplifier for amplifying a signal output from said logical product circuit in the final set, said input/output selector further comprising sets of a second information holding circuit and a signal selector respectively provided for the output signals, said second information holding circuit taking in an output signal supplied at the transition timing to output the output signal, said signal selector selecting the output signal supplied or the output signal of said second information holding circuit in response to the mode signal specifying the test mode.

4. The semiconductor device in accordance with claim 3, wherein said timing adjuster adjusts three timings in, outputting a clock signal for the input signals with the delay devices, and has a bypass of the delay devices, said timing adjuster outputting a timing-adjusted input signal and a timing-unadjusted input signal on each of input signals except the clock signal to said first information holding circuit of one of the sets.

* * * * *